(12) United States Patent
Wang et al.

(10) Patent No.: US 10,847,375 B2
(45) Date of Patent: Nov. 24, 2020

(54) SELECTIVE ATOMIC LAYER ETCHING

(71) Applicant: Lam Research Corporation, Fremont, CA (US)

(72) Inventors: Chia-Chun Wang, Fremont, CA (US); Eric Hudson, Berkeley, CA (US); Andrew Clark Serino, Livermore, CA (US); Nerissa Draeger, Fremont, CA (US); Zhonghao Zhang, Santa Clara, CA (US)

(73) Assignee: Lam Research Corporation, Fremont, CA (US)

( * ) Notice: Subject to any disclaimer, the term of this patent is extended or adjusted under 35 U.S.C. 154(b) by 95 days.

(21) Appl. No.: 16/019,169

(22) Filed: Jun. 26, 2018

(65) Prior Publication Data

US 2019/0393046 A1 Dec. 26, 2019

(51) Int. Cl.
*H01L 21/311* (2006.01)
*H01L 21/02* (2006.01)

(52) U.S. Cl.
CPC .. *H01L 21/31116* (2013.01); *H01L 21/02205* (2013.01); *H01L 21/31144* (2013.01); *H01J 2237/3346* (2013.01)

(58) Field of Classification Search
CPC ......... H01L 21/31116; H01L 21/02205; H01L 21/31144; H01J 37/00; H01J 2237/3346
See application file for complete search history.

(56) References Cited

U.S. PATENT DOCUMENTS

| | | | |
|---|---|---|---|
| 6,518,168 B1 * | 2/2003 | Clem | B05D 1/283 438/623 |
| 9,837,312 B1 * | 12/2017 | Tan | C23C 18/1628 |
| 10,361,091 B2 * | 7/2019 | Hudson | H01L 21/31116 |
| 10,541,144 B2 * | 1/2020 | Hudson | H01L 21/31116 |
| 2012/0141731 A1 | 6/2012 | Mirkin et al. | |
| 2014/0091279 A1 | 4/2014 | Kachian et al. | |
| 2015/0118834 A1 | 4/2015 | Loh et al. | |

(Continued)

FOREIGN PATENT DOCUMENTS

WO 2017/030967 2/2017

OTHER PUBLICATIONS

International Search Report and Written Opinion from International Application No. PCT/US2019/035623 dated Sep. 23, 2019.

*Primary Examiner* — Anita K Alanko
(74) *Attorney, Agent, or Firm* — Beyer Law Group LLP

(57) ABSTRACT

A method for selectively etching a dielectric layer with respect to an epitaxial layer or metal-based hardmask is provided. The method comprises performing a plurality of cycles. Each cycle comprises a deposition phase and an activation phase. The deposition phase comprises flowing a deposition gas, wherein the deposition gas comprises helium and a hydrofluorocarbon or fluorocarbon, forming the deposition gas into a plasma to effect a fluorinated polymer deposition, and stopping the flow of the deposition gas. The activation phase comprises flowing an activation gas comprising an ion bombardment gas, forming the activation gas into a plasma, providing an activation bias to cause ion bombardment of the fluorinated polymer deposition, wherein the ion bombardment activates fluorine from the fluorinated polymer deposition to etch the dielectric layer, and stopping the flow of the activation gas.

10 Claims, 8 Drawing Sheets

(56) References Cited

U.S. PATENT DOCUMENTS

| | | | |
|---|---|---|---|
| 2016/0013063 A1* | 1/2016 | Ranjan | H01J 37/32816 |
| | | | 438/714 |
| 2016/0293398 A1 | 10/2016 | Danek et al. | |
| 2016/0293432 A1* | 10/2016 | Ranjan | H01J 37/32963 |
| 2018/0226260 A1* | 8/2018 | Romm | H01L 21/3081 |
| 2018/0240674 A1* | 8/2018 | Bilodeau | H01L 21/02304 |
| 2018/0247832 A1* | 8/2018 | Fischer | H01L 21/225 |
| 2019/0267282 A1* | 8/2019 | Gstrein | H01L 21/76897 |

* cited by examiner

SELECTIVE ATOMIC LAYER ETCHING

BACKGROUND

Field

The present disclosure relates to methods of forming semiconductor devices on a semiconductor wafer. More specifically, the present disclosure relates to etching a silicon containing layer.

In forming semiconductor devices, a silicon containing layer may be etched in order to form semiconductor devices, such as memory devices.

SUMMARY

To achieve the foregoing and in accordance with the purpose of the present disclosure, a method for selectively etching a dielectric layer with respect to an epitaxial layer or metal-based hardmask, and improving surface roughness of the etch front is provided. The method comprises performing a plurality of cycles in an etch chamber. Each cycle comprises a deposition phase and an activation phase. The deposition phase comprises flowing a deposition gas into the etch chamber, wherein the deposition gas comprises helium and a hydrofluorocarbon or fluorocarbon, forming the deposition gas into a plasma, to effect a fluorinated polymer deposition, and stopping the flow of the deposition gas into the etch chamber. The activation phase comprises flowing an activation gas comprising an ion bombardment gas into the etch chamber, forming the activation gas into a plasma, providing an activation bias in the etch chamber to cause ion bombardment of the fluorinated polymer deposition, wherein the ion bombardment activates fluorine from the fluorinated polymer deposition to etch the dielectric layer, and stopping the flow of the activation gas into the etch chamber.

In another manifestation, a method for selectively etching a dielectric layer with respect to a germanium containing or a metal containing layer is provided. The method comprises at least one cycle in an etch chamber, wherein each cycle comprises a treatment phase and an etch phase. The treatment phase comprises flowing a treatment gas comprising a thiol containing gas into the etch chamber, selectively forming a passivation layer from the thiol containing gas on the germanium containing layer or the metal containing layer with respect to the dielectric layer, and stopping the flow of the treatment gas into the etch chamber. An etch phase etches the dielectric layer.

These and other features of the present disclosure will be described in more details below in the detailed description of the disclosure and in conjunction with the following figures.

BRIEF DESCRIPTION OF THE DRAWINGS

The present disclosure is illustrated by way of example, and not by way of limitation, in the figures of the accompanying drawings and in which like reference numerals refer to similar elements and in which.

DETAILED DESCRIPTION OF THE PREFERRED EMBODIMENTS

Figure 1:
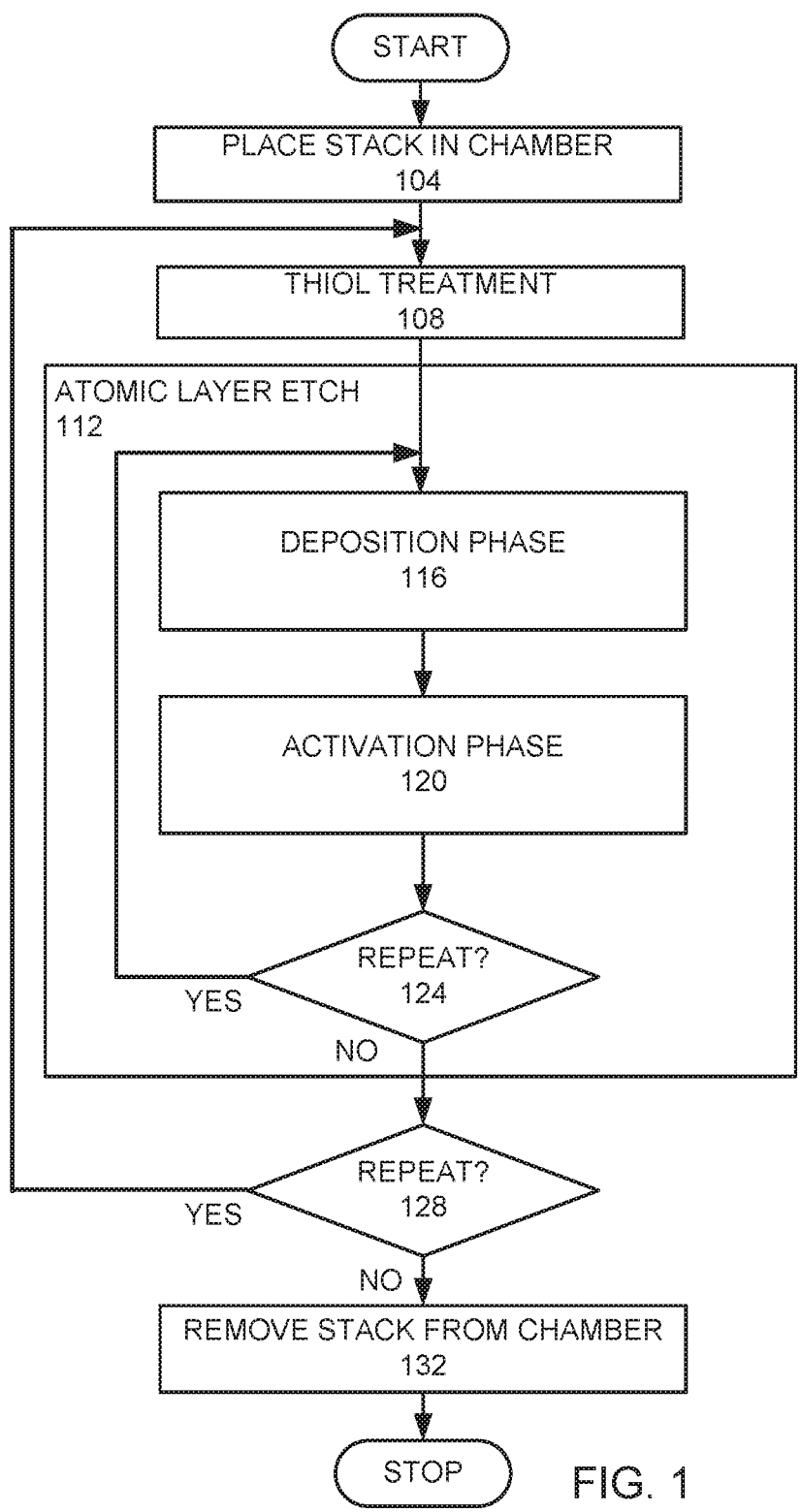
FIG. 1 is a high level flow chart of an embodiment.

The present disclosure will now be described in detail with reference to a few preferred embodiments thereof as illustrated in the accompanying drawings. In the following description, numerous specific details are set forth in order to provide a thorough understanding of the present disclosure. It will be apparent, however, to one skilled in the art, that the present disclosure may be practiced without some or all of these specific details. In other instances, well known process steps and/or structures have not been described in detail in order to not unnecessarily obscure the present disclosure.

Atomic layer etching (ALE) is widely used in semiconductor logic device source/drain contact etch processes, in which alternating argon (Ar) based deposition steps and activation steps are applied to increase the etch selectivity for etching silicon oxide ($SiO_2$) with respect to a fin field effect transistor (FinFET) epitaxial (epi) structures of silicon germanium (SiGe) or silicon (Si) or germanium (Ge) material. A deposition step of the ALE may contain a fluorocarbon gas with Ar as a carrier gas, to deposit a fluorinated polymer layer at the etch front covering both epitaxial and $SiO_2$ layers. During an activation step, which uses much higher bias and therefore, stronger ion bombardment, the $Ar^+$ ion bombardment can effectively produce etching at the $SiO_2$/fluorinated polymer interface by creating reactive sites and inducing a chemical reaction between the $SiO_2$ and the fluorinated polymer. On the other hand, the etch reaction between epitaxial material and fluorinated polymer is much less efficient compared to $SiO_2$/fluorocarbon reaction. Therefore, the hydrocarbon layer created by deposition step in fact acts as a protection layer for epitaxial material and minimal epitaxial material etch happens during activation step. As iterating ALE steps proceed, the $SiO_2$ etch keeps going while a hydrocarbon layer builds up on the epitaxial material. $SiO_2$ to epitaxial layer etch selectivity is then achieved through this approach.

However, in practice, there is always a trade-off between $SiO_2$/FinFET epitaxial material etch selectivity and $SiO_2$ etch front roughness with a traditional Ar based ALE process, leading to compromised device performance. When rich chemistry and/or low activation bias are used (causing faster hydrocarbon buildup on the epitaxial material), high $SiO_2$:epitaxial material selectivity and minimal epitaxial material loss can be achieved (electron mobility maintained). However, a rough $SiO_2$ etch front is observed at the same time, causing increased contact resistivity or even open contacts. In contrast, when a lean chemistry and/or higher bias are used (causing less hydrocarbon deposition during deposition step: less hydrocarbon build-up at $SiO_2$ etch front but also less protection to epitaxial material), a smooth $SiO_2$ etch front can be achieved, causing good contact resistivity. However, low $SiO_2$:epitaxial selectivity and significant epitaxial material loss is observed (compromised electron mobility).

In logic contact etching, existing etch processes mostly use fluorocarbon compounds such as hexafluorobutadiene ($C_4F_6$) or octafluorocyclobutane ($C_4F_8$) as etch gases for SiO$_2$, and as passivation gases for Ge/SiGe during the etch steps. However, at the Ge/SiGe locations, the surface passivation layer from fluorocarbon may etch Ge/SiGe due to the presence of fluorine. As a result, material loss of Ge/SiGe will be observed as the etching of SiO$_2$ proceeds.

FIG. 1 is a high level flow chart of an embodiment. In this embodiment, a stack is placed in an etch chamber (step 104). Preferably, the stack comprises a substrate located under a dielectric layer, with an epitaxial structure or a metal containing layer. A thiol treatment is provided (step 108). Next, the dielectric layer is selectively etched with respect to the epitaxial structure or metal containing layer using an atomic layer etch (ALE) (step 112). ALE involves a cyclical process having multiple cycles. In each cycle, there is a deposition phase (step 116) and an activation phase (step 120). During the deposition phase, a deposition gas that may comprise helium and a hydrofluorocarbon or fluorocarbon is used to deposit a fluorinated polymer deposition. During the activation phase, ion bombardment is used to activate the fluorinated polymer deposition to etch the dielectric layer. A determination is made whether to repeat the cycle (step 124). If the cycle is repeated, the process is returned to the deposition phase (step 116). After a sufficient number of ALE cycles are repeated, a determination is made if another thiol treatment is needed (step 128). If the thiol treatment is repeated (step 108), the atomic layer etch (step 112) is repeated. After a sufficient number of cycles is completed (step 128), the stack is removed from the etch chamber (step 132).

EXAMPLE

Figure 2:
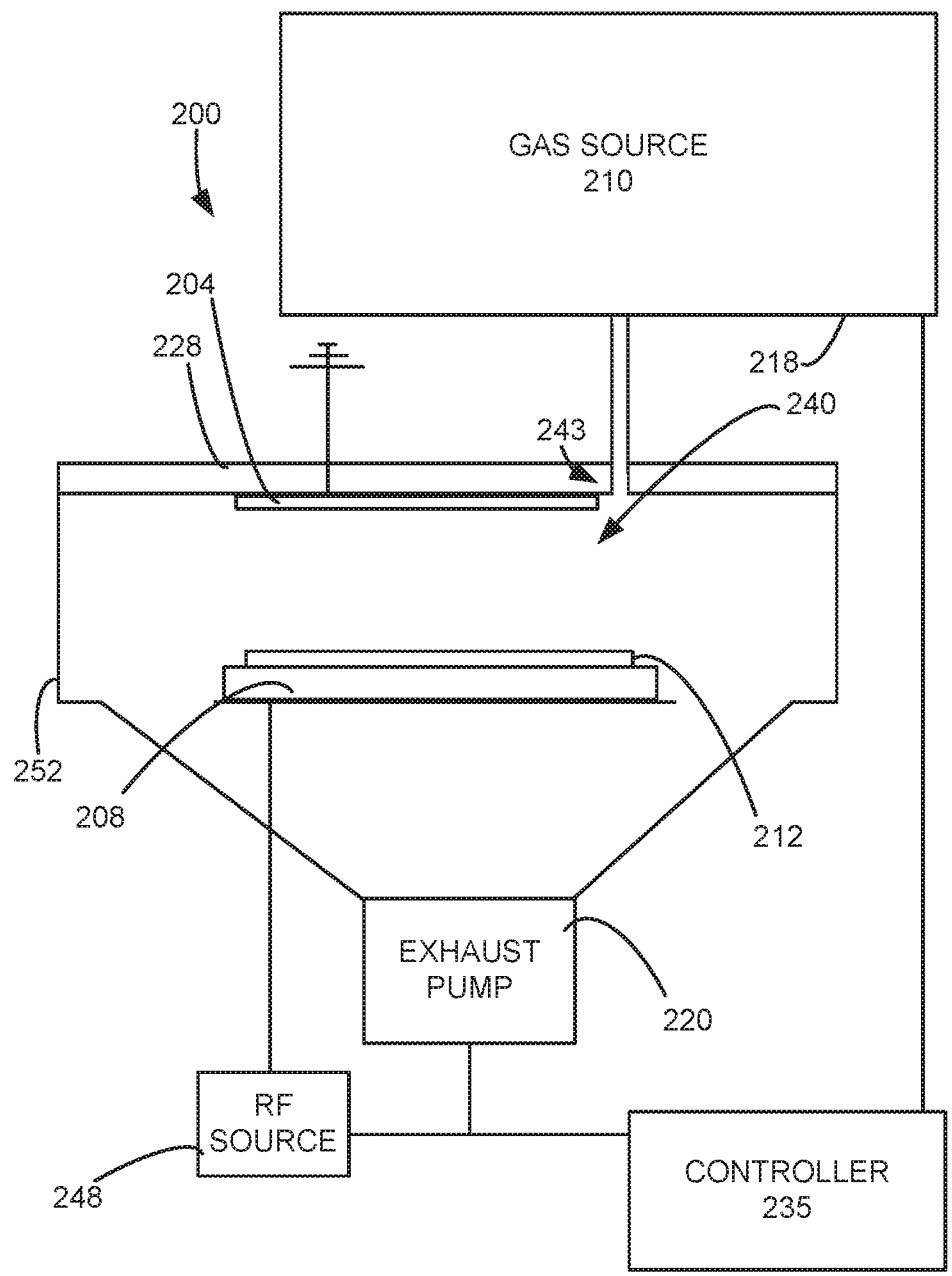
FIG. 2 is a schematic view of a plasma processing chamber that may be used in an embodiment.

FIG. 2 is a schematic view of an etch chamber 200 that may be used for one or more of the following steps. The etch chamber 200 comprises an upper electrode 204, a lower electrode 208, a gas source 210, and an exhaust pump 220. Within etch chamber 200, a stack 212 is positioned upon the lower electrode 208. The lower electrode 208 incorporates a suitable substrate chucking mechanism (e.g., electrostatic, mechanical clamping, or the like) for holding the stack 212. The reactor top 228 incorporates the upper electrode 204 disposed immediately opposite the lower electrode 208. The upper electrode 204 and lower electrode 208 define the confined plasma volume 240. Gas is supplied to the confined plasma volume 240 through a gas inlet 243 by the gas source 210 and is exhausted from the confined plasma volume 240 through an exhaust port by the exhaust pump 220. Besides helping to exhaust the gas, the exhaust pump 220 helps to regulate pressure. An RF source 248 is electrically connected to the lower electrode 208. Chamber walls 252 surround the upper electrode 204, and the lower electrode 208. Different combinations of connecting RF power to the electrode are possible. In a preferred embodiment, the 27 MHz, 60 MHz, and 2 MHz power sources make up the RF source 248 connected to the lower electrode 208, and the upper electrode 204 is grounded. A controller 235 is controllably connected to the RF source 248, exhaust pump 220, and the gas source 210. Preferably, the etch chamber 200 is a CCP (capacitive coupled plasma) reactor, as shown. In other embodiments, an ICP (inductive coupled plasma) reactor or other sources like surface wave, microwave, or electron cyclotron resonance (ECR) may be used.

Figure 3:
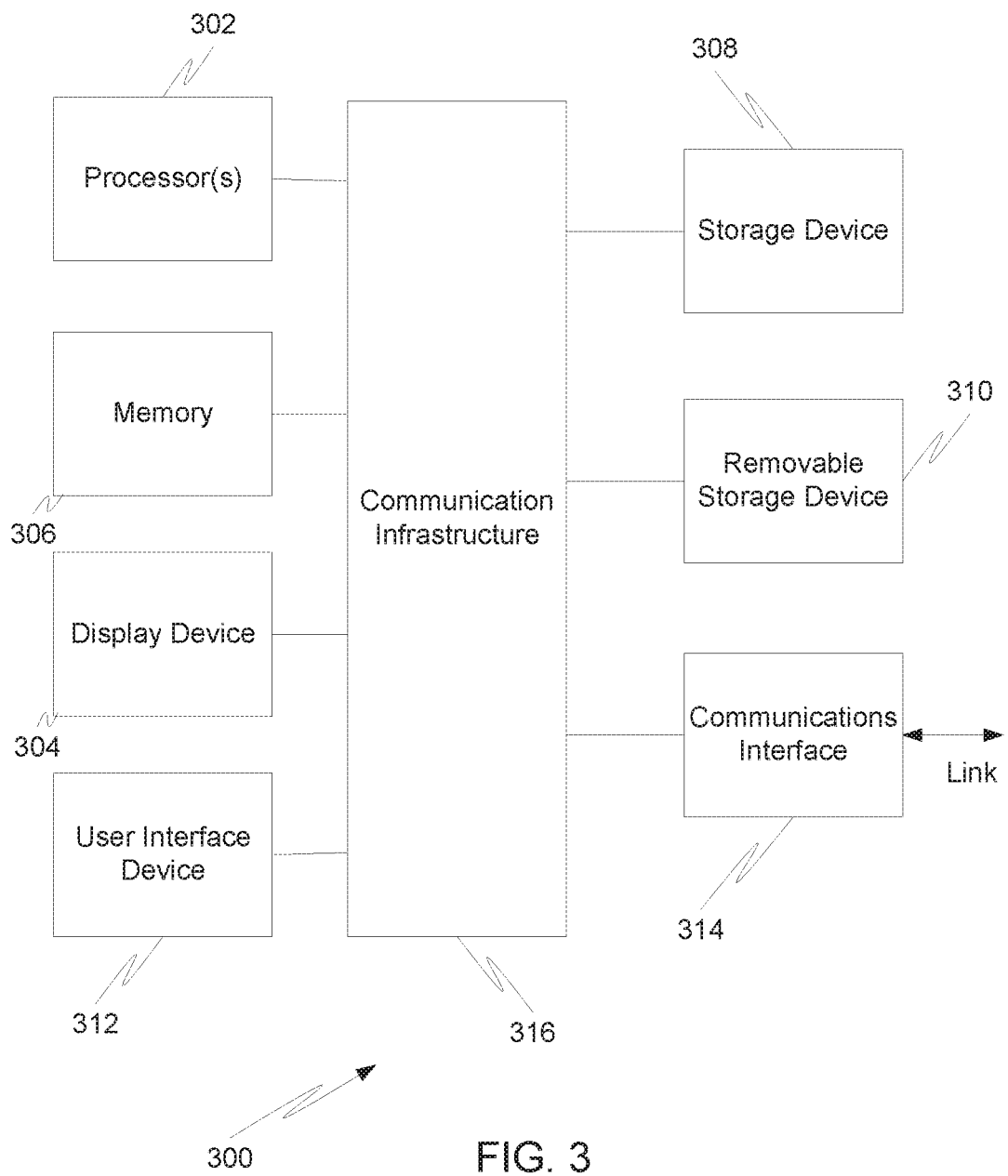
FIG. 3 is a schematic view of a computer system that may be used in practicing an embodiment.

FIG. 3 is a high level block diagram showing a computer system 300, which is suitable for implementing a controller 235 used in embodiments. The computer system may have many physical forms ranging from an integrated circuit, a printed circuit board, and a small handheld device up to a huge super computer. The computer system 300 includes one or more processors 302, and further can include an electronic display device 304 (for displaying graphics, text, and other data), a main memory 306 (e.g., random access memory (RAM)), storage device 308 (e.g., hard disk drive), removable storage device 310 (e.g., optical disk drive), user interface devices 312 (e.g., keyboards, touch screens, keypads, mice or other pointing devices, etc.), and a communication interface 314 (e.g., wireless network interface). The communication interface 314 allows software and data to be transferred between the computer system 300 and external devices via a link. The system may also include a communications infrastructure 316 (e.g., a communications bus, cross-over bar, or network) to which the aforementioned devices/modules are connected.

Information transferred via communications interface 314 may be in the form of signals such as electronic, electromagnetic, optical, or other signals capable of being received by communications interface 314, via a communication link that carries signals and may be implemented using wire or cable, fiber optics, a phone line, a cellular phone link, a radio frequency link, and/or other communication channels. With such a communications interface, it is contemplated that the one or more processors 302 might receive information from a network, or might output information to the network in the course of performing the above-described method steps. Furthermore, method embodiments may execute solely upon the processors or may execute over a network, such as the Internet, in conjunction with remote processors that shares a portion of the processing.

The term "non-transient computer readable medium" is used generally to refer to media such as main memory, secondary memory, removable storage, and storage devices, such as hard disks, flash memory, disk drive memory, CD-ROM, and other forms of persistent memory and shall not be construed to cover transitory subject matter, such as carrier waves or signals. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

Figure 4A:
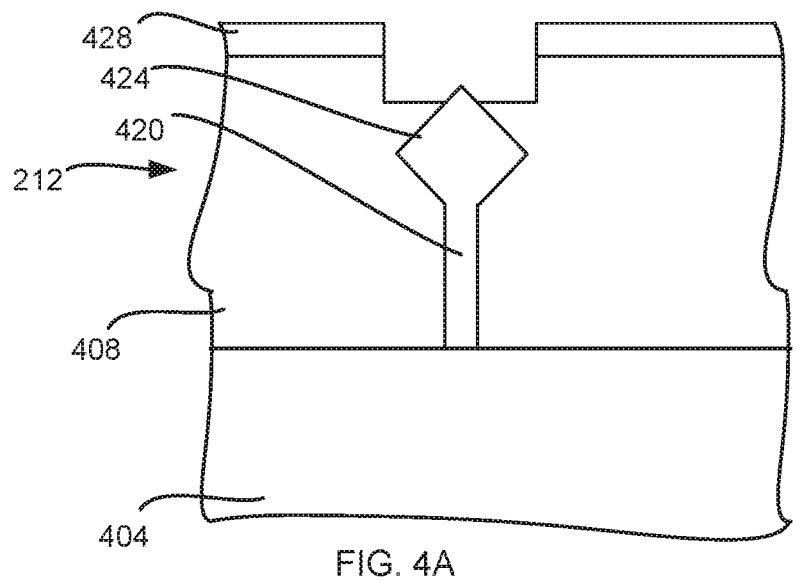
FIGS. 4A-F are schematic cross-sectional views of a stack processed according to an embodiment.

In an exemplary embodiment, a stack is placed in an etch chamber (step 104). FIG. 4A is a schematic cross-sectional view of the stack 212. The stack 212 includes a substrate 404 located under a dielectric layer 408. The dielectric layer 408 includes a FinFET structure 420. In this embodiment, the dielectric layer 408 is a silicon oxide (SiO$_2$) or SiO$_2$ based layer. The FinFET structure 420 is of either SiGe or Si or a combination thereof. SiGe or Si includes doped and undoped SiGe or Si. The top of the FinFET structure 420 has been enlarged using epitaxy forming an epitaxial layer 424. The stack 212 further includes a metal containing layer 428 which is formed over the dielectric layer 408 to act as an etch mask. In this example, the metal containing layer 428 is tungsten carbide.

Figure 5:
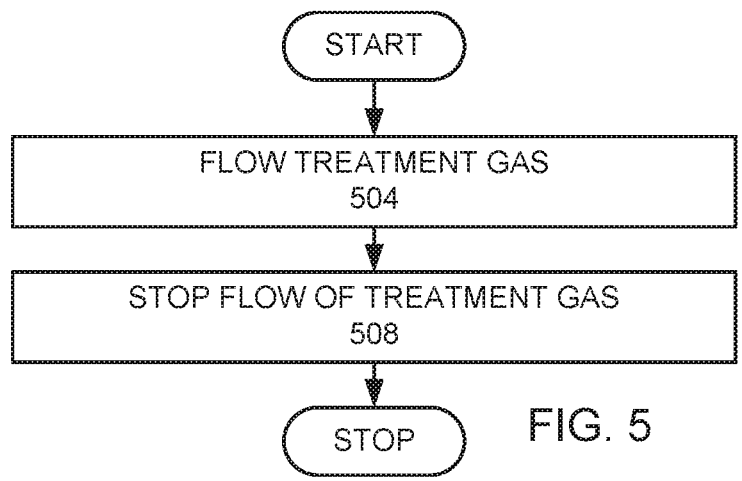
FIG. 5 is a more detailed flow chart of treatment phase according to an embodiment.

After the stack 212 has been placed into the etch chamber 200, a thiol treatment is provided (step 108). FIG. 5 is a more detailed flow chart of the thiol treatment (step 108). A treatment gas comprising a thiol containing gas is flowed into the etch chamber 200 (step 504). Thiol is an organic compound containing a functional group consisting of sulfur and hydrogen (R—S—H). In this embodiment, the thiol containing gas comprises octanethiol (C$_8$H$_{18}$S). In various embodiments, the thiol containing gas is a hydrocarbon with a sulfur and hydrogen functional group. In this example, the temperature is maintained above 60° C. to facilitate deposition. Thiol containing gas selectively deposits on germanium and metal containing layers, to form a hydrocarbon passivation layer on the germanium and metal containing layers. When the thiol treatment is to be concluded, the flow of the treatment gas is stopped (step 508).

Figure 4B:
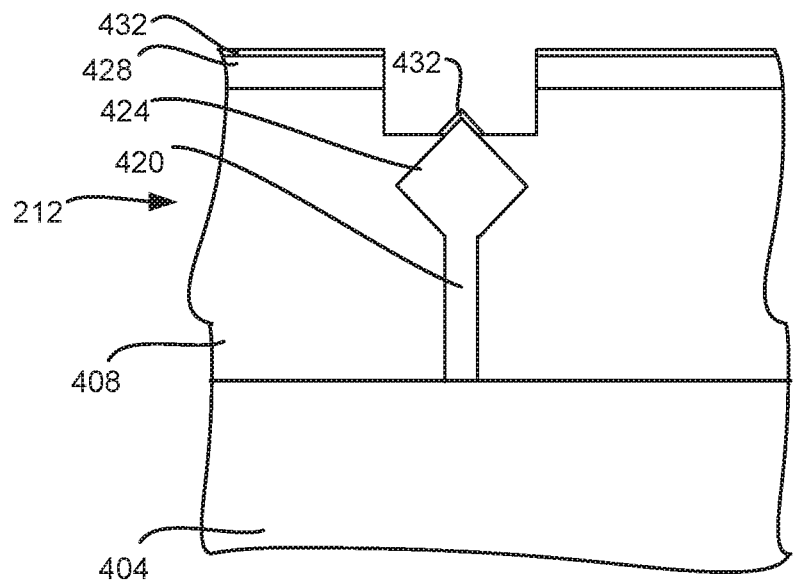

FIG. 4B is a schematic cross-sectional view of the stack 212 after the thiol treatment is completed. A hydrocarbon layer 432 with a sulfur head is selectively deposited on the epitaxial layer 424 and the metal containing layer 428, where the sulfur head forms a bond with the epitaxial layer 424 and the metal containing layer 428. The coating of hydrocarbon layer is not drawn to scale, but is drawn thicker to better facilitate understanding.

Figure 6:
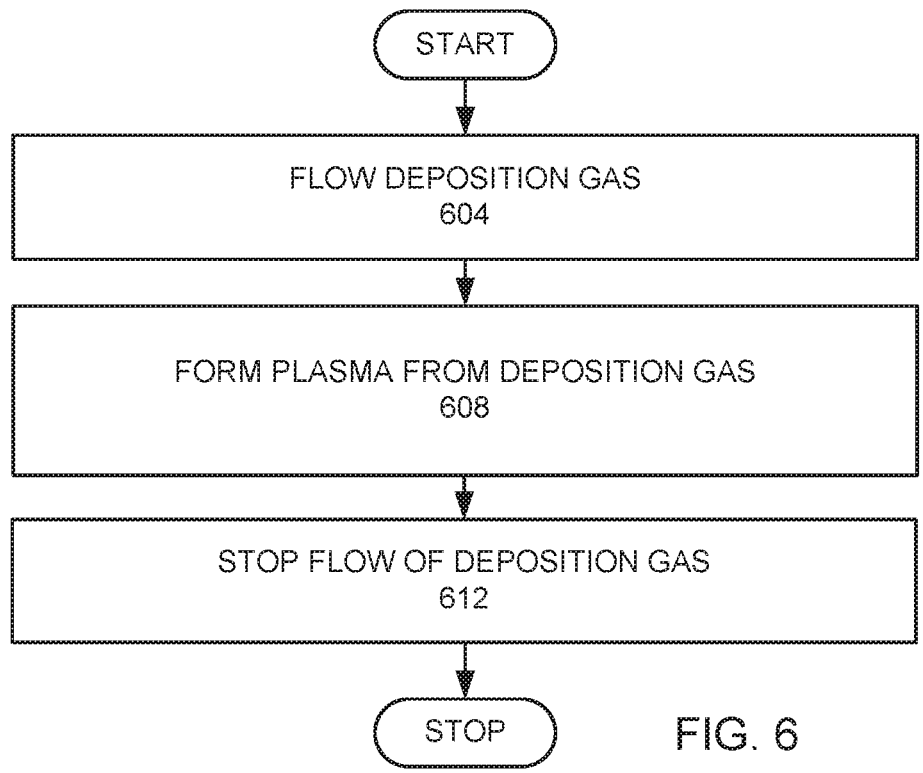
FIG. 6 is a more detailed flow chart of the deposition phase according to an embodiment.

The dielectric layer 408 is selectively etched with respect to the FinFET structure 420 or metal containing layer 428 using ALE (step 112). Each cycle of the ALE (step 112) comprises a deposition phase (step 116) and an activation phase (step 120). FIG. 6 is a more detailed flow chart of the deposition phase (step 116). A deposition gas is flowed into the etch chamber (step 604), wherein the deposition gas comprises helium and a hydrofluorocarbon or fluorocarbon. In this embodiment, the deposition gas flow is between 1 to 20 sccm of $C_4F_6$, 1 to 20 sccm $O_2$, 10-200 sccm CO, and 100 to 2000 sccm He. RF power is provided at 60 MHz and/or 27 MHz at a power between 10-200 Watts to transform the deposition gas into a plasma (step 608), which deposits fluorinated polymer on the stack 212. The flow of the deposition gas is stopped (step 612) after 1 to 15 seconds.

Figure 4C:
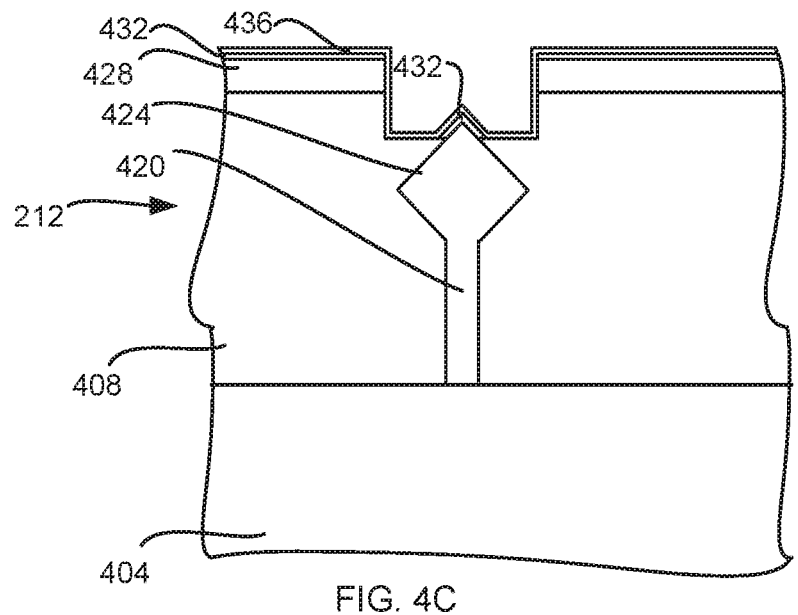

FIG. 4C is a schematic cross-sectional view of the stack 212 after the deposition phase (step 116) is completed. A thin conformal layer of fluorinated polymer layer 436 is deposited on the stack 212. The fluorinated polymer layer 436 is not drawn to scale, but is drawn thicker to better facilitate understanding.

Figure 7:
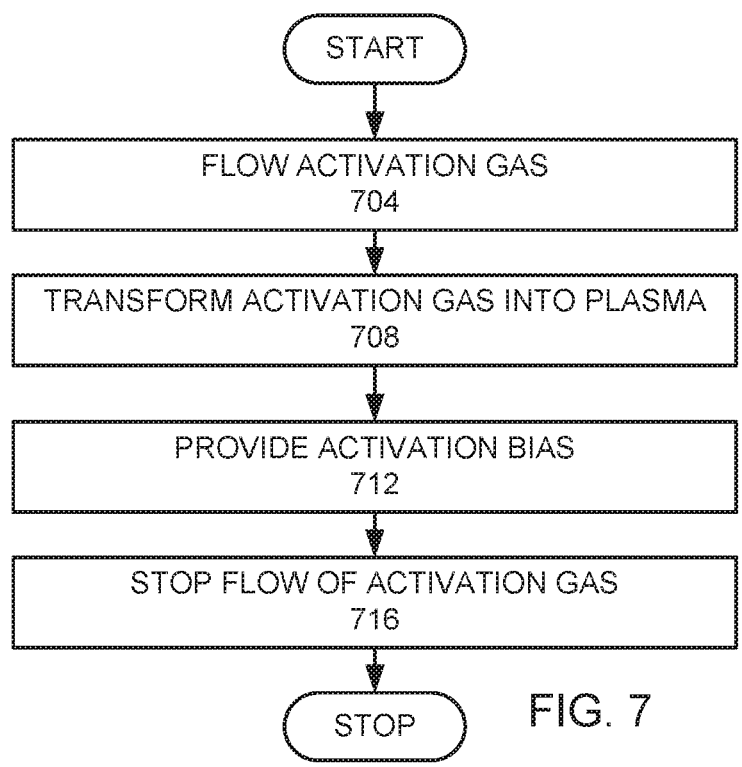
FIG. 7 is a more detailed flow chart of the activation phase according to an embodiment.

The activation phase then follows the deposition phase. During the activation phase, the deposited layer, i.e., the fluorinated polymer layer 436, is activated (step 120). FIG. 7 is a more detailed flow chart of the activation phase. An activation gas is flowed into the etch chamber 200 (step 704). In this example, the activation gas is 300 sccm Ar, which is an ion bombardment gas. The activation gas consists essentially of Ar. A chamber pressure of 10 mTorr and a wafer temperature of 80° C. is provided. The activation gas is transformed into a plasma (step 708). In this embodiment, 30-200 Watts of RF power is provided at 2 MHz and 30-300 Watts of RF power is provided at 60 MHz, thereby transforming the activation gas into a plasma. An activation bias ranging from −20V to −400V volts is provided (step 712). The activation bias is an electrical potential on the substrate 404 resulting from the combination of RF power and plasma, which causes ions to be accelerated from the plasma to the substrate 404. After 1-5 seconds, the flow of the activation gas is stopped (step 716).

Figure 4D:
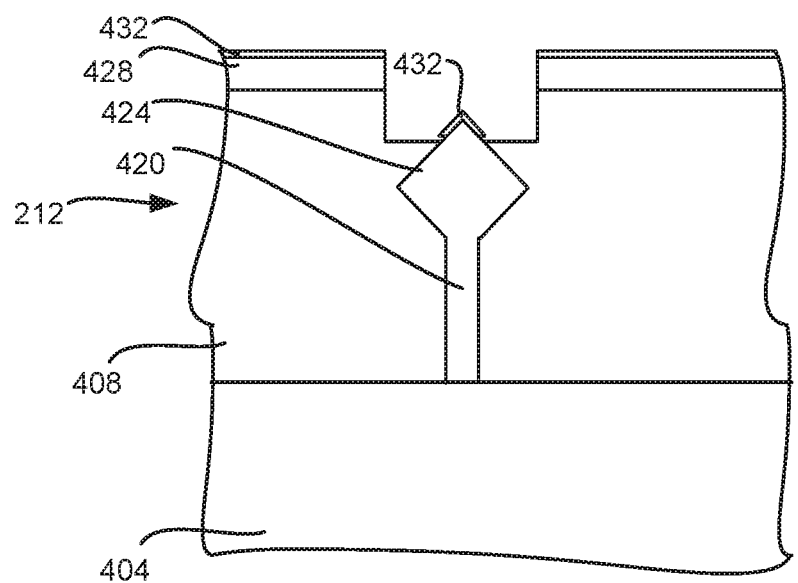

FIG. 4D is a schematic cross-sectional view of the stack 212 after the fluorinated polymer layer 436 (not shown in FIG. 4D) has been activated. When activated, the fluorine in the fluorinated polymer layer 436 (not shown in FIG. 4D) etches the dielectric layer 408. The fluorinated polymer layer 436 (not shown in FIG. 4D) is completely removed and some of the dielectric layer 408 is etched.

Figure 4E:
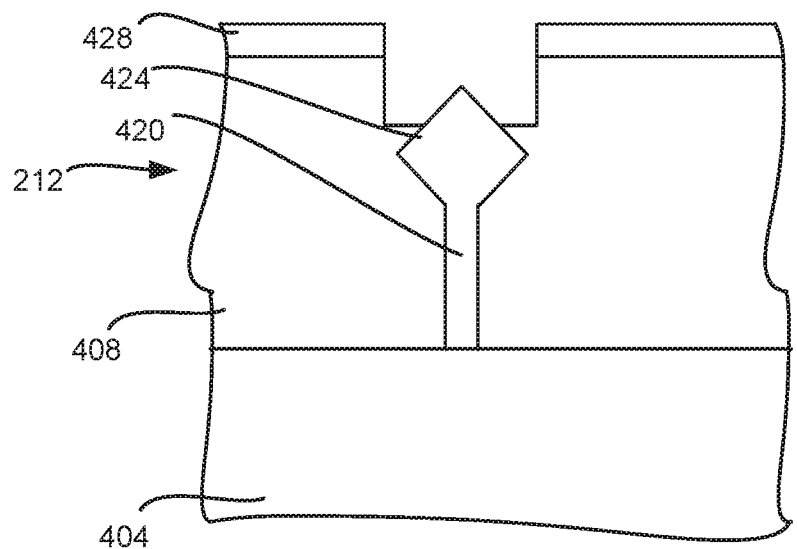

Preferably, the ALE (step 112) is repeated from five (5) to a hundred (100) times (step 124). FIG. 4E is a schematic cross-sectional view of the stack 212 after the ALE (step 112) process is repeated a number of times, where the hydrocarbon layer 432 with the sulfur head (not shown in FIG. 4E) has been removed and the dielectric layer 408 is partially etched.

Since the etch is not complete and the hydrocarbon layer 432 with the sulfur head has been removed, a repeat step (step 128) returns to the thiol treatment (step 108). The thiol treatment selectively deposits a hydrocarbon layer with a sulfur head on the germanium containing epitaxial layer 424 and metal containing layer 428. The atomic layer etch (step 112) is again performed on the dielectric layer 408. The process may be repeated until the etch process is completed.

Figure 4F:
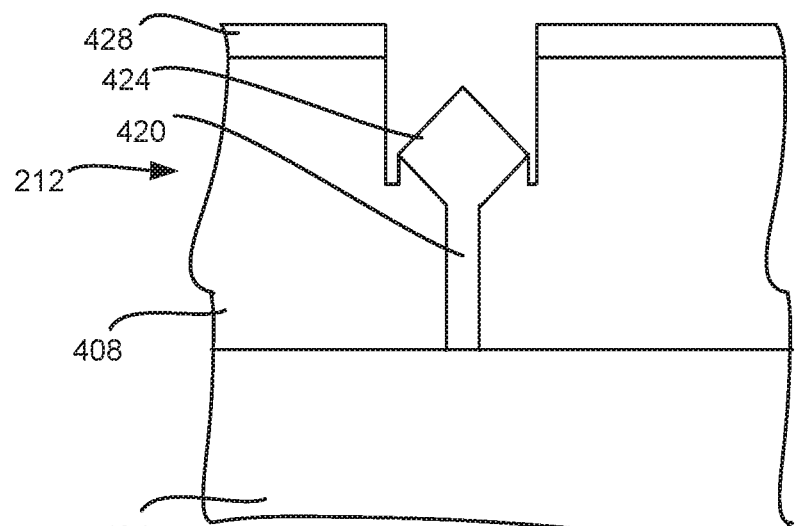

FIG. 4F is a schematic cross-sectional view of the stack 212 after the etch process is completed. Since the dielectric layer 408 is highly selectively etched with respect to the epitaxial layer 424, part of the dielectric layer 408 is etched past the epitaxial layer 424, while the epitaxial layer 424 acts as an etch mask for the part of the dielectric layer below part of the epitaxial layer 424. The stack 212 may be processed with other steps. The stack 212 may be subjected to additional processing before the stack 212 is removed from the etch chamber 200 (step 132).

In the above embodiment, He is used instead of Ar in the deposition phase (step 116). This result has been demonstrated to break the tradeoff between roughness and $SiO_2$: epitaxial etch selectivity. Without being bound by theory, the root cause of epitaxial loss is believed to be too much bombardment or insufficient protection, while the root cause of a rough $SiO_2$ etch front is believed to be carbon rich residue left over at the end of each etch cycle. With the He based deposition phase (step 116), instead of using an Ar based deposition, the rough etch front root cause can be resolved without worsening the epitaxial loss problem. The etch front residue problem can also be resolved with a low bias condition by adjusting the molar ratio of fluorine to carbon (F/C ratio) in the hydrocarbon layer 432 created by deposition step. In a well balanced, spontaneous reaction between $SiO_2$ and fluorocarbon, the fluorocarbon has a fluorine to carbon (F/C) ratio that would optimally be in the range of about 2:1 as described in the following proposed chemical reaction. $SiO_2 + 2CF_2 \rightarrow SiF_4 + 2CO$. However, without being bound by theory, it is believed that it is difficult to deposit and maintain a polymer with ratio as high as 2:1, due to ion bombardment of the film which tends to cause defluorination.

It is believed that He would cause less defluorination of the fluorinated hydrocarbon deposition than Ar. If the F/C ratio is too low, carbon cannot be completely consumed and carbon rich residue islands are left at the etch front. Therefore, a strategy to avoid $SiO_2$ etch surface roughness is to increase the F/C ratio. When Ar is used as the deposition carrier gas, the polymer created usually has a relatively low F/C ratio (0.6-0.7). This is believed to be caused by polymer defluorination from $Ar^+$ ion bombardment during the deposition step. When He is used as deposition carrier gas, the F/C ratio in the resulting hydrocarbon layer 432 is significantly higher (0.9-1.0) than an Ar based processes. This is believed to be mainly due to the smaller mass of the $He^+$ which leads to less defluorination. Therefore, through increasing the F/C ratio in comparably thick polymer, more efficient carbon consumption is achieved during the activation phase, while maintaining a good protection to the epitaxial material. As a result, significant improvement of etch front roughness with a reduction in epitaxial loss were observed by experiment. In this embodiment, the ratio of the flow rate of moles of He to moles of fluorine is between 10:1 to 300:1.

An additional mechanism for providing the benefit of less bombardment with He+ ions is that at the beginning and earlier stage of each deposition step, when there is no or very little hydrocarbon deposition protection on epitaxial material, the finite amount of epitaxial loss caused by a low bias deposition plasma is less than the epitaxial loss from Ar based deposition processes. This is due to lower momentum of He+ compared to Ar+ ions, for nominally the same bias and ion energy. Also, the He+ ions are less efficient at transferring momentum to Si and Ge atoms. The use of He may result in increasing the F/C ratio in the deposited hydrocarbon deposition to address the $SiO_2$ etch front roughness issue without sacrificing more epitaxial material.

In one embodiment, the activation bias has a magnitude that is below a bias needed to cause sputtering of the dielectric layer 408 but equal to or above a bias needed to activate the fluorinated hydrocarbon deposition. For example, for silicon oxide, the activation bias has a magnitude below 80 volts and above 30 volts. Activation of the fluorinated polymer is provided by physical bombardment energy. Since the activation energy is less than the energy needed for sputtering, the amount of etching is dependent only on the fluorinated polymer. As a result, horizontal surfaces may be selectively etched with respect to vertical surfaces, and depth loading may be improved. In other embodiments, different activation biases may be used. In such embodiments, the activation bias may have a magnitude greater than 80 volts. In other embodiments, the activation bias may be pulsed by using RF pulsing. In an embodiment, the pulsed activation bias may provide a bias magnitude greater than 30 volts. In some embodiments, the activation bias provided by pulsing has a maximum magnitude between 30 volts and 800 volts. In some embodiments, the activation bias provided by RF pulsing includes a low bias state with a magnitude between 0 to 200 volts and a high bias state between 30 to 1000 volts. In some embodiments, the activation gas comprises an inert bombardment gas and a reactive gas.

In various embodiments, a treatment step is used to passivate Ge/SiGe layers by thermal absorption of thiol-based compounds which will not absorb on silicon oxide surfaces. An example of thiol compound is octanethiol which is Self-Assembled Monolayer (SAM) on Ge/SiGe surface and composed of hydrocarbon segment free of fluorine. The thiol-based compound could form Ge-S bond to complete the chemical absorption on Ge/SiGe surface without the presence of plasma, so that the passivation process may be plasma free. After the passivation on a Ge/SiGe surface by the selective treatment step, a following etch phase could proceed to etch silicon oxide while a hydrocarbon layer protects the Ge/SiGe surface to prevent or mitigate etch behavior of the Ge/SiGe surface. Thiol-based compounds could be implemented not only for Ge/SiGe surfaces, but also for any other metal containing surfaces, which could form a chemical bond with sulfur, such as ruthenium (Ru), tungsten (W) or cobalt (Co). Preferably, the thiol-based compound has a chain length of at least eight carbons. It is believed that using carbon chains of ten (10) to fifteen (15) carbons in the thiol-based compounds would provide a more selective etch. Chain length for the thiol-based compounds may be used as a tuning parameter. The thiol-based deposition protects from physical etching by ion bombardment and by chemical etching from fluorine.

The thiol-based deposition provides the following advantages: 1. Non-plasma deposition—which could prevent any risk on the initial material loss of Ge/SiGe due to ion bombardment from the plasma. 2. Selective deposition on Ge/SiGe over silicon oxide-combined with selective etch processes, a high etch selectivity of silicon oxide over Ge/SiGe could be achieved. 3. Self-Assembled Monolayer (SAM)-uniform deposition on Ge/SiGe across the wafer would mitigate non-uniform passivation which might also cause non-uniform material loss of Ge/SiGe.

In some embodiments, the thiol treatment (step 108) provides sufficient Ge/SiGe layer passivation, so that another noble gas, such as Ar, may be used instead of He during the deposition phase (step 116) of the atomic layer etch (step 112). In other embodiments, the use of He during the deposition phase (step 116) of the atomic layer etch (step 112) may provide sufficient etch selectivity for etching $SiO_2$ with respect to an epitaxial layer, so that a thiol treatment (step 108) is not needed. In some embodiments, a single thiol treatment (step 108) is used, instead of providing thiol treatments (step 108) for a plurality of cycles. However, in the above embodiment, more of the epitaxial layer is exposed during the etch, requiring additional thiol treatments (step 108). In some embodiments, a thiol treatment (step 108) may be used with other etch processes instead of an atomic layer etch. Preferably, the thiol treatment (step 108) is plasma free to prevent damage to the Ge/SiGe layer. However, some embodiments may use a plasma during the thiol treatment (step 108). Preferably, the thiol treatment (step 108) is provided at a temperature above 60° C.

Various embodiments provide a height to width etch aspect ratio of greater than 10:1. In various embodiment, features with a critical dimension (CD) of less than 20 nm are provided.

While this disclosure has been described in terms of several preferred embodiments, there are alterations, modifications, permutations, and various substitute equivalents, which fall within the scope of this disclosure. It should also be noted that there are many alternative ways of implementing the methods and apparatuses of the present disclosure. It is therefore intended that the following appended claims be interpreted as including all such alterations, modifications, permutations, and various substitute equivalents as fall within the true spirit and scope of the present disclosure.

What is claimed is:

1. A method for selectively etching a dielectric layer with respect to an epitaxial layer, wherein the epitaxial layer is a germanium containing material, or metal-based hardmask, and improving surface roughness of the etch front, the method comprising:

flowing a thiol containing treatment gas into the etch chamber;

selectively forming a passivation layer from the thiol containing treatment gas on the epitaxial layer or metal-based hardmask with respect to the dielectric layer;

stopping the flow of the thiol containing treatment gas into the etch chamber; and performing a plurality of cycles in an etch chamber, wherein each cycle comprises:

a deposition phase, comprising:

flowing a deposition gas into the etch chamber, wherein the deposition gas comprises helium and a hydrofluorocarbon or fluorocarbon;

forming the deposition gas into a plasma to effect a fluorinated polymer deposition; and stopping the flow of the deposition gas into the etch chamber; and an activation phase, comprising:

flowing an activation gas comprising an ion bombardment gas into the etch chamber;

forming the activation gas into a plasma;
providing an activation bias in the etch chamber to cause ion bombardment of the fluorinated polymer deposition, wherein the ion bombardment activates fluorine from the fluorinated polymer deposition to etch the dielectric layer; and
stopping the flow of the activation gas into the etch chamber.

2. The method, as recited in claim 1, wherein the activation gas comprises argon.

3. The method, as recited in claim 1, wherein the deposition gas is argon free.

4. The method, as recited in claim 3, wherein the activation gas consists essentially of argon.

5. The method, as recited in claim 1, wherein the fluorocarbon or hydrofluorocarbon comprises at least one of $C_4F_6$ or $C_4F_8$.

6. The method, as recited in claim 1, wherein the dielectric layer is a silicon oxide containing layer.

7. The method, as recited in claim 1, wherein the dielectric layer is a silicon oxide layer.

8. The method, as recited in claim 1, wherein the plurality of cycles is at least five cycles.

9. The method, as recited in claim 1, wherein the deposition gas has a helium to a hydrofluorocarbon or fluorocarbon flow rate ratio of between about 10:1 to 300:1.

10. The method, as recited in claim 1, wherein the activation bias is less than a bias needed to sputter the dielectric layer.

* * * * *